United States Patent [19]
Hoh et al.

[11] Patent Number: 5,874,363
[45] Date of Patent: Feb. 23, 1999

[54] POLYCIDE ETCHING WITH HCL AND CHLORINE

[75] Inventors: Peter D. Hoh, Hopewell Junction, N.Y.; Tokuhisa Ohiwa, Takatsu-ku, Japan; Virinder Grewal, Fishkill, N.Y.; Bruno Spuler, Munich, Germany; Waldemar Kocon, Wappingers Falls; Guadalupe Wiltshire, Hopewell Junction, both of N.Y.

[73] Assignees: Kabushiki Kaisha Toshiba, Kanagawa-ken, Japan; International Business Machines Corporation, Armonk, N.Y.; Siemens Components, Inc., Iselin, N.J.

[21] Appl. No.: 645,458

[22] Filed: May 13, 1996

[51] Int. Cl.$^6$ .................................................. H01L 21/3065
[52] U.S. Cl. ............................................ 438/721; 438/738
[58] Field of Search ..................... 438/738, 737, 438/735, 721, 720, 710; 216/72, 67, 63, 75, 79

[56] References Cited

U.S. PATENT DOCUMENTS

| | | | |
|---|---|---|---|
| 5,110,408 | 5/1992 | Fujii et al. | 156/643 |
| 5,169,487 | 12/1992 | Langley et al. | 156/643 |
| 5,200,028 | 4/1993 | Tatsumi | 156/656 |
| 5,219,485 | 6/1993 | Wang et al. | 252/79.3 |
| 5,223,085 | 6/1993 | Kawai et al. | 156/646 |
| 5,259,923 | 11/1993 | Hori et al. | 156/643 |
| 5,354,416 | 10/1994 | Okudaira et al. | 156/643 |
| 5,358,601 | 10/1994 | Cathey | 156/656 |
| 5,387,556 | 2/1995 | Xiaobing et al. | 437/228 |
| 5,543,362 | 8/1996 | Wu | 437/200 |

*Primary Examiner*—Marion McCamish
*Assistant Examiner*—Cheryl Juska
*Attorney, Agent, or Firm*—Banner & Witcoff, Ltd.

[57] ABSTRACT

Metal silicide is removed at a faster rate than polysilicon in dry etching of metal silicide/polysilicon composites with an etching gas made from HCl and $Cl_2$ at a volumetric flowrate ratio of $HCl:Cl_2$ within the range of 3:1 to 5:1.

10 Claims, No Drawings

POLYCIDE ETCHING WITH HCL AND CHLORINE

FIELD OF THE INVENTION

The invention relates to a process for etching composite surfaces of a metal silicide over a layer of polysilicon.

BACKGROUND OF THE TECHNOLOGY

Semiconductor devices have been forced to become smaller and thinner without loss of speed or performance. Frequently, the smaller devices must perform at even higher levels. These competing demands, size v. performance, challenge manufacturers to advance their art. Usually, a metal silicide (e.g., $TiSi_x$, $TaSi_x$, $MoSi_x$, or $WSi_x$) of 50–300 nm is applied over a polysilicon surface layer of 50–400 nm that is insulated from the immediately preceding layer by a layer of silica ($SiO_2$) that is relatively thin, e.g., about 10–30 nm. One area of importance is in the field of etching such surfaces to impart a pattern to the surface. Importantly, etching should: (a) form the desired pattern with an anisotropic profile (i.e., generate a clean, perpendicular etched surface); (b) without contaminating the etched layers; (c) without damaging the film such as might occur by overetching into the silica layer; and (d) with a uniform etching rate across the etched surface.

There are several types of etching systems and a plurality of etching chemistry schemes. The two most common dry etching processes are plasma etching and reactive ion etching. Of these, reactive ion etching is generally preferred for high resolution replication of photoresist patterns in electrically conductive materials. The charged nature of the ions permits a greater degree of control over an impingement pattern that is perpendicular to the mask surface. Reactive ion etching is generally performed with conditions that include: an etching gas pressure of 30–200 mTorr, an etching gas flow rate of 20–100 sccm, and either a low temperature within the range of $-10°$ C. and $-120°$ C. (see, U.S. Pat. No. 5,259,923) or a relatively high temperature within the range of $50°$ C. to $130°$ C. (see, U.S. Pat. No. 5,354,416).

The etching gas compositions used in the art have varied but are generally based on fluorine or chlorine chemistry. U.S. Pat. No. 5,110,408 describes a plasma etching process with a plasma made from gas of $SF_6$, $CH_2F_2$, and $Cl_2$. It is said that the chlorine helps to remove deposits made from the reaction by-products and protects the silica layer by increasing the selectivity of the etching process.

U.S. Pat. No. 5,200,028 uses a similar gas composition, but with differing ratios of HBr:F* ratios, for etching the silicide layer and the polysilicon layer.

U.S. Pat. No. 5,219,485 etches the silicide layer with a mixture of HCl, $BCl_3$, and $Cl_2$. The volumetric flowrate ratios of $HCl:BCl_3:Cl_2$ are within 75:(30–40):(25–40). It is taught that the ratio of $BCl_3:Cl_2$ is at least 1:1. The polysilicon layer is etched without the $BCl_3$. If desired, $NF_3$ may be added to increase the etching rate. Overall, it is taught that the process should be operated to achieve an etching rate ratio (R) of silicide: polysilicon of (1–2):1, preferably about 2:1. The specification refers to removal rates on the order of 90–110 nm/min. (e.g., col. 8, line 8).

U.S. Pat. No. 5,223,085 employs plasma etching with HCl and $Cl_2$ at a flowrate of 30–200 sccm, a pressure of 0.1–1 Pa, and 50–500 W of microwave power. The $Cl_2$:HCl ratio is 2:1 (i.e., a ratio of $HCl:Cl_2$ of 0.5).

U.S. Pat. No. 5,259,923 describes the use of two, and possibly three, etching gases. The first gas is selected from F, $SF_6$, or $NF_3$. The optional second gas is selected from HCl, HBr, $Cl_2$, Br, or $CCl_4$. The third gas is a combination of the second gas and an inert gas, nitrogen, oxygen, silicon tetrachloride, or carbon monoxide. The ratio of $SF_6:Cl_2$ is within 4:6 to 7:3 at a flowrate of 20–150 sccm, a temperature of $-10°$ C. to $-120°$ C., and a pressure of 50–150 mTorr. The etching rate with 100% chlorine gas on silica was reported as 12 nm/min. Use of 20% $SF_6$ and 80% $Cl_2$ increased the silica etch rate to 36 nm/min. Etching rates for $WSi_x$ was 350 nm/min at $25°$ C. with a corresponding silica etch rate of 70 nm/min. When the temperature was reduced to $-30°$ C., the silicide etch rate dropped to 300 nm/min, and the silica etch rate fell slightly to 60 nm/min.

U.S. Pat. No. 5,354,416 similarly describes the use of fluorine, chlorine, $SF_6$, or $NF_3$ as etching gases that reduce reaction byproduct deposits during the etching process. Removal rates are about 300 nm/min at temperatures of $-60°$ C. to $-150°$ C. and gas pressures of 1–10 mTorr.

Unfortunately, the conventional etching gas compositions and processes seek to increase the rate of etching in order to accelerate the manufacturing process. Typical chlorine-based etch systems have an etching rate of about 500 nm/min. Such processes may have had their place when metal silicide layers were relatively thick so there was time to control the etching duration. The newer films are, however, significantly thinner. The newer metal silicide layers have a thickness of about 30–75 nm. Conventional etching processes are too fast with a low degree of selectivity for etching the silicide layer in preference to the polysilicon layer. The etch duration is too short to control with the high degree of accuracy required for devices made from modern films.

It would be useful to have a process for etching metal silicide that was selective to silicide relative to polysilicon and more controllable.

SUMMARY OF THE INVENTION

It is an objective of the invention to provide a selective process for etching a pattern into the metal silicide layer of a metal silicide/polysilicon composite.

In accordance with this and other objectives of the invention that will become apparent from the description herein, a process according to the invention involves etching a metal silicide layer at a rate faster than a polysilicon layer in a metal silicide/polysilicon composite by an etching process that includes contacting said metal silicide layer with a plasma made from a flowing gas mixture of HCl and $Cl_2$ exhibiting a volumetric flowrate ratio of $HCl:Cl_2$ within the range of 3:1 to 6:1.

The process of the invention provides a readily controlled process for selectively etching the metal silicide from metal silicide/polysilicon composites. Such selectivity provides the designer with profile and fabrication possibilities not previously available.

DETAILED DESCRIPTION OF THE INVENTION

The present invention relates to a process for selectively etching the metal silicide layer in metal silicide/polysilicon composites with an etching gas containing HCl and chlorine ($Cl_2$) in a volumetric flowrate ratio of $HCl:Cl_2$ within the range of 3:1 to 5:1. Preferably, the volumetric flowrate ratio is within the range of 3:1–4:1, and the etching gas is free of $BCl_3$ and is not required as in U.S. Pat. No. 5,219,485. This etching gas is selective toward metal silicide over polysilicon (i.e., removes the metal silicide at a faster rate than the polysilicon) and exhibits a slower, more controllable rate of material removal under standard etching conditions. The net effect is a controllable, efficient process for etching thin layers of metal silicide in a metal silicide/polysilicon composite with low risk of damage.

Once the metal silicide layer is removed, the etched surface can be further processed. If further etching of the polysilicon layer is desired, the relative proportions of the etch gas can be adjusted to a $HCl:Cl_2$ ratio of less than 3. The etched surface can also be given an intermediate coating of another material (conductive or insulating), masked with the same or different pattern, and etched at a ratio of HCl to $Cl_2$ that is less than 3.

In general, the electrically conductive composites etched by the present invention have a first layer containing a metal silicide over a second layer of polysilicon. The metal silicide layer is based on titanium ($TiSi_x$), tantalum ($TaSi_x$), molybdenum ($MoSi_x$), or tungsten ($WSi_x$) and can be deposited on the polysilicon layer by any suitable deposition method, e.g., CVD, vapor deposition, ion gas, or sputter coating.

In general, the metal silicide layer will exhibit a thickness within the range from about 20–200 nm, preferably about 50–150 nm. The underlying polysilicon layer will exhibit a thickness within the range from about 20–200 nm, preferably about 50–150 nm. In some composites, the polysilicon layer is deposited over an insulating layer (e.g., silica) exhibiting a thickness within the range from about 5–50 nm.

In some cases, composites can be coated with a surface layer of native oxide. In such cases, the native oxide layer can be removed by adding a small amount, e.g., about 0.01–10 vol %, preferably about 1–6 vol %, of an etching accelerator, such as $NF_3$, to the initial flow of etchant gas. The $NF_3$ will accelerate the etching rate and remove the native oxide layer quickly. Care should be taken, however, to include the etching accelerator for only so long as is necessary to remove the native oxide coating.

Addition of similar small amounts of an etching accelerator, like $NF_3$, or oxygen ($O_2$) may be added to the etchant gas flow occasionally if reaction by-products begin to form deposits in the etched surface or within the etching chamber. The $NF_3$ and oxygen react with polymer deposits to form volatile compounds that are readily flushed from the workpiece and the chamber.

The electrically conductive metal silicide/polysilicon composites for etching by the present process can exhibit a number of physical forms with a number of uses. Exemplary composites include bipolar and CISFET integrated circuits, gate electrodes, single level and multi-layer interconnects, resistors, buried contacts, self-aligned emitters and self-aligned emitter-contact structures, and MOSFET integrated circuits. The selective etching process of the present invention is particularly useful when making CMOS.

As is conventional in the art, a masking material is deposited on the metal silicide layer in a designated pattern. An etching gas, in the form of a plasma or stream of reactive ions, is then directed toward the masked surface. The etching gas will remove material not protected by the masking material until the flow of etchant is terminated. For the present invention, any of the conventional masking agents may be used.

Any of the methods and devices used to perform plasma or reactive ion etching can be used for the process of the present invention. A particularly preferred method for performing the etching is with inductively coupled high density plasma reactive ion etching (ICHDPRIE).

The etching process of the invention is conducted at conditions suitable for plasma etching the metal silicide layer without significant change in the dimensions of the mask. For ICHDPRIE, suitable etching conditions include those in Table 1.

TABLE 1

| Condition | Range | Preferred Range |
|---|---|---|
| Temperature (°C.) | 20–60 | 40–60 |
| Total pressure (mTorr) | 2–8 | 4–6 |
| $HCl:Cl_2$ flowrate (sccm) | 3:1–5:1 | 3:1–4:1 |
| Plasma source power (W) | 150–300 | 175–225 |
| Wafer bias power (W) | 150–200 | 165–185 |

EXAMPLES

Examples 1–5

In examples 1–5, samples of tungsten silicide/polysilicon composite were subjected to inductively coupled plasma etching using different flowrates HCl and chlorine. Table 2 reports the respective removal rates of each layer. Unless otherwise noted, all flowrates are in terms of sccm (standard cubic centimeters per minute) and all removal rates are measured in units of nm/minute. Oxygen was added at 3 sccm to control deposits of reaction by-products. All other conditions were the same.

TABLE 2

| Ex. | HCl flow | $Cl_2$ flow | $HCl:Cl_2$ | $WSi_x$ Removal | PolySi Removal | Silicide Selectivity |
|---|---|---|---|---|---|---|
| 1 | 0 | 40 | 0 | 400 | 875 | 0.4 |
| 2 | 20 | 40 | 0.5 | 387 | 666 | 0.6 |
| 3 | 40 | 40 | 1 | 375 | 400 | 0.9 |
| 4 | 80 | 40 | 2 | 368 | 387 | 0.9 |
| 5 | 120 | 40 | 3 | 355 | 243 | 1.65 |

Examination of the relative removal rates shows that increasing the HCl content of the etch gas reduced the removal rates of both the tungsten siuicide and the polysilicon. At removal ratios of less than 1, the tungsten silicide was removed less quickly than polysilicon. At a $HCl:Cl_2$ gas flowrate ratio of 3, however, the relative removal rates changed, and tungsten silicide was removed faster than the polysilicon. Such a change in selectivity is surprising and unexpected.

It will be understood that the foregoing examples are presented merely for purposes of illustration and are not intended to serve as limitations on the scope of the appended claims.

We claim:

1. A process for etching a metal silicide layer at a rate faster than a polysilicon layer in a metal silicide/polysilicon composite by an etching process that comprises:

contacting said metal silicide layer with a plasma free of $BCl_3$ made from a flowing gas mixture of HCl and $Cl_2$ exhibiting a $HCl:Cl_2$ flowrate ratio within the range of 3:1 to 5:1, said flowing gas consisting essentially of HCl and $Cl_2$.

2. A process as in claim 1 wherein said plasma is generated by inductive coupling.

3. A process as in claim 2 wherein a temperature of said plasma is within the range of 20°–60° C.

4. A process as in claim 3 wherein a temperature of said plasma is within the range of 40°–60° C.

5. A process as in claim 1 wherein said flowrate ratio is within the range of 3:1–4:1.

6. A process for etching a metal silicide layer at a rate faster than a polysilicon layer in a metal silicide/polysilicon composite by an etching process that comprises:

contacting said metal silicide layer with a stream of reactive ions made from a flowing gas mixture of HCl and $Cl_2$ exhibiting a $HCl:Cl_2$ flowrate ratio within the range of 3:1–5:1, at a temperature within the range from 40°–60° C., said flowing gas consisting essentially of HCl and $Cl_2$.

7. A process for etching a masked metal silicide/polysilicon composite by the steps comprising:

contacting said composite with a plasma free of $BCl_3$ or reactive ion stream made from a flowing gas comprising $NF_3$, HCl, and $Cl_2$ for a time sufficient to remove native oxide from said composite;

discontinuing flow of said $NF_3$, and etching said metal silicide layer at a rate faster than said polysilicon by contacting said composite with a plasma or reactive ion stream made from a flowing gas comprising HCl and $Cl_2$ in a $HCl:Cl_2$ flowrate ratio within the range of 3:1 to 5:1 for a time sufficient to remove said metal silicide from unmasked areas of said composite.

8. A process as in claim 7 further comprising:

changing said $HCl:Cl_2$ flowrate ratio to a value of less than 3 to etch said polysilicon after etching said metal silicide layer.

9. A process as in claim 7 wherein said flowing gas consists essentially of HCl and $Cl_2$ in said step of etching said metal silicide layer.

10. A process as in claim 7, wherein said flowing gas consists essentially of HCl, $Cl_2$, and oxygen in said step of etching said metal silicide layer.

* * * * *

UNITED STATES PATENT AND TRADEMARK OFFICE
CERTIFICATE OF CORRECTION

PATENT NO.: 5,874,363

DATED: February 23, 1999

INVENTORS: Peter D. HOH et al.

It is certified that error appear in the above-identified patent and that said Letters Patent is hereby corrected as shown below:

Item [73],
Title page, in the Assignee data, delete "Siemens Components, Inc., Iselin, N.J." and add --Siemens Aktiengesellschaft, Munich, Fed. Rep. Germany--.

Signed and Sealed this

Eighth Day of February, 2000

*Attest:*

Q. TODD DICKINSON

*Attesting Officer*   *Commissioner of Patents and Trademarks*